United States Patent [19]

Pankove

[11] 4,139,858
[45] Feb. 13, 1979

[54] SOLAR CELL WITH A GALLIUM NITRIDE ELECTRODE

[75] Inventor: Jacques I. Pankove, Princeton, N.J.

[73] Assignee: RCA Corporation, New York, N.Y.

[21] Appl. No.: 859,858

[22] Filed: Dec. 12, 1977

[51] Int. Cl.² ............................................. H01H 27/14
[52] U.S. Cl. ........................................ 357/30; 357/61; 357/65
[58] Field of Search .................... 357/30, 61, 65, 17, 357/18

[56] References Cited

U.S. PATENT DOCUMENTS

| | | | |
|---|---|---|---|
| 3,649,838 | 3/1972 | Phelan, Jr. | 250/211 J |
| 3,683,240 | 8/1972 | Pankove | 317/234 R |
| 3,877,058 | 4/1975 | Cricchi | 357/24 |
| 3,922,703 | 11/1975 | Pankove | 357/17 |
| 4,028,720 | 6/1977 | Pankove | 357/30 |

OTHER PUBLICATIONS

Pankove, *Journal of Luminescence*, 7(1973) pp. 114–126.
Pankove, *R.C.A. Review*, 34, Jun. 1973, pp. 336–343.
Maruska et al., *Mat. Res. Bull.* vol. 7, No. 8, pp. 777–782 (1972).
Maruska et al. *Solid State Electronics*, vol. 17, 1974, pp. 1171–1179.

*Primary Examiner*—Martin H. Edlow
*Attorney, Agent, or Firm*—H. Christoffersen; B. E. Morris; A. Stephen Zavell

[57] ABSTRACT

A solar cell which comprises a body of silicon having a P-N junction therein with a transparent conducting N-type gallium nitride layer as an ohmic contact on the N-type side of the semiconductor exposed to solar radiation.

7 Claims, 2 Drawing Figures

SOLAR CELL WITH A GALLIUM NITRIDE ELECTRODE

The Government has rights in this invention pursuant to Contract No. EY-76-C-03-1286 awarded by the Energy Research And Development Administration.

The present invention relates to photovoltaic devices and more particularly to photovoltaic devices having semiconductor bodies and ohmic contacts transparent to impinging solar radiation.

BACKGROUND OF THE INVENTION

Photovoltaic devices such as solar cells are capable of converting solar radiation energy into usable electrical energy. Energy conversion occurs as the result of what is well known in the solar cell field as the "photovoltaic effect". Two basic steps are involved in the photovoltaic effect. Initially, solar radiation absorbed by the semiconductor generates electrons and holes. Secondly, the electrons and holes are separated by a built-in electric field in the semiconductor solar cell device. This separation of electrons and holes results in the generation of an electrical current. A built-in electrical field can be generated in a solar cell by, for example, a P-N junction. The electrons generated at the P-N junction flow towards the N-type material to which an ohmic contact must be formed to collect the electrons. The ohmic contact may be either a metallic grid system or a transparent highly conducting N-type semiconductor.

The standard grid ohmic contact consists of a six fingered geometric pattern of a metal such as gold, chromium, silver, etc. U.S. Pat. No. RE. 28,610 teaches an improved finger geometric pattern for collecting photocurrent. However, a grid system suffers from the shadowing effect of the metal fingers, which reduces the total area of the solar cell which can be exposed to solar radiation, and thereby reduces the total collectable photocurrent.

Transparent metals or metal oxides, such as indium tin oxide, tin oxide, or copper oxide, do not shadow the solar cells due to their transparency; however, the metal oxides have higher resistivities than the metal fingers. This limits the usable voltage available from the photocell. In addition, the bandgap of the oxides may be sufficiently low to shield or filter out some of the solar radiation. Furthermore, tin oxide and indium tin oxide tend to chip or flake when applied in a sufficient thickness to reduce the resistance of the coating.

Thus, it would be desirable to have a transparent metal or semiconductor coating with a low resistivity, which is transparent to visible and infrared solar radiation, and has a high thermal conductivity and stability to elevated temperatures for use in solar cells with solar concentrators.

SUMMARY OF THE INVENTION

A semiconductor photovoltaic device comprising a body of semiconductor material having a P-N junction contained therein and a transparent, conductive gallium nitride electrode layer forming an ohmic contact on the surface of the N-type layer which is exposed to solar radiation.

DETAILED DESCRIPTION OF THE INVENTION

Figure 1:
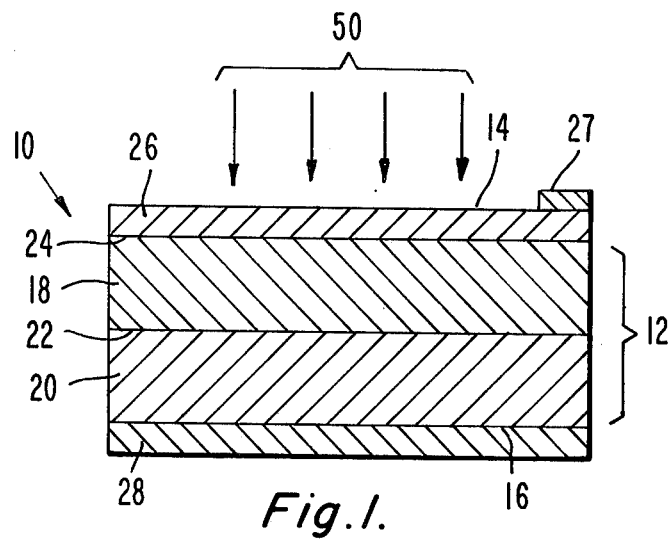
FIG. 1 is a cross-sectional view of a photovoltaic device of the present invention wherein the GaN layer is deposited on the semiconductor material.

Referring to FIG. 1, a semiconductor photovoltaic device of the present invention is designated as 10. The semiconductor photovoltaic device of the present invention will be described as a P-N junction solar cell, however, my invention is also applicable to Schottky barrier cells, heterojunctions, and vertical multijunctions. The solar cell 10 includes a body 12 of silicon with a first layer 18 of N-type conductivity and second layer 20 of P-type conductivity. Thus, a P-N junction 22 is formed between the first and second layers 18 and 20. Preferably, the P-N junction 22 is graded from P-type to N-type rather than an abrupt P-type N-type transition. The layers 18 and 20 are doped by methods known in the art, such as the employment of phosphorus to provide an N-type conductivity layer, and boron to provide a P-type conductivity layer, or other dopants known in the art.

The body 12 has an incident surface 14 on which solar radiation 50 impinges and an opposite surface 16.

Along the incident surface 14 is a transparent, conducting gallium nitride electrode 26. The GaN electrode 26 forms a heterotransition 24 with the N-type first layer 18. A heterotransition is defined as the contacting of two layers of different materials wherein both materials are of the same conductivity type. A metal contact 27 is formed on electrode 26 to facilitate attaching a wire (not shown) to withdraw the current generated by the operation of the device.

Gallium nitride (GaN) is N-type and highly conducting in an undoped state. The transparent, conducting, low resistivity gallium nitride electrode 26 forms an ohmic contact on the solar cell without the shadowing normally encountered with finger or grid electrodes.

On the opposite surface 16 is an electrode 28 which also forms an ohmic contact with semiconductor body 12 on the P-type conductivity layer 20. The electrode 28 can be a single layer of metal such as aluminum, or multilayered, for example, a first layer directly on the body 12 of chromium with second layer of a metal such as gold on the chromium layer. Preferably, the single layer of metal is a sintered aluminum electrode.

Figure 2:
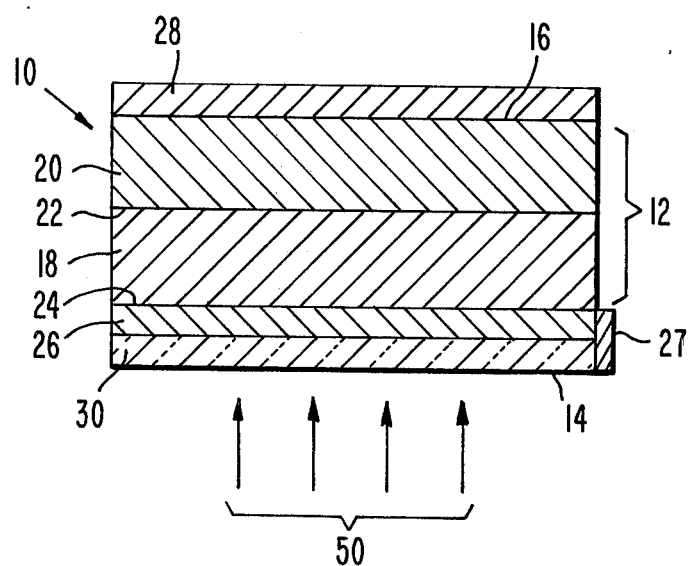
FIG. 2 is a cross-sectional view of a photovoltaic device wherein the semiconductor material is applied onto the GaN layer.

Referring to FIG. 2, the photovoltaic device of the present invention is designated as 10. The photovoltaic device 10 comprises a substrate 30 which is transparent to solar radiation 50 and preferably transparent to solar radiation in the visible and infrared portion of the spectrum, such as sapphire, quartz, pyrex, or other suitable materials. The transparent N-type conducting gallium nitride electrode 26 is deposited on substrate 30. The body 12 is formed of a semiconductor material having an N-type conductivity 18 and a P-type conductivity 20 with a P-N junction 22 therebetween. The N-type layer 18 of semiconductor body 12 forms a heterotransition 24 with the gallium nitride electrode 26. A metal contact 27 contacting GaN electrode 26 permits a wire (not shown) to be attached to said electrode to withdraw the current generated by the cell 10 when exposed to solar radiation 50. A second electrode 28 forms an ohmic contact with the P-type semiconductor material 20. Electrode 28 may be any suitable metal such as aluminum or a chromium-gold combination.

The highly conducting undoped N-type gallium nitride layer can be deposited on the semiconductor material if said material is stable at 900° C. (FIG. 1). If the semiconductor material is not stable at 900° C., the gallium nitride is first deposited on a solar radiation transparent substrate capable of withstanding 900° C. temperatures. Thereafter, the transparent substrate and gallium nitride are cooled to a temperature low enough to deposit the semiconductor material on the gallium nitride layer (FIG. 2). For example, gallium nitride can be deposited on a crystalline silicon semiconductor body, but amorphous silicon, cadmium telluride, gallium arsenide, and gallium arsenide-aluminum arsenide alloys should be deposited on the gallium nitride layer.

The transparent, conducting, N-type gallium nitride is deposited on either the semiconductor material or the substrate by chemical vapor deposition at temperatures greater than 800° C. and preferably 900° C., according to the following reaction:

$$GaCl + NH_3 \rightarrow GaN + H_2 + HCl$$

The chemical vapor deposition of GaN is applied by methods known in the art and first described by H. P. Maruska and J. J. Tietjen, Appl. Phys. Letters, Vol. 15, No. 10, pp. 327-329 (1969).

Alternatively, the gallium nitride may be applied by epitaxial deposition according to methods known in the art if the substrate lends itself to epitaxial deposition.

The gallium nitride layer should be thick enough to achieve a sheet resistance of less than about 10 ohm/sq. Generally, about a 1 micron ($\mu$m) thick layer is sufficient to achieve this resistance. If the GaN layer is grown to a thickness of 10-20 $\mu$ms, then crystalline facets develop at one surface of the layer which helps trap more light by multiple internal reflections. Thus a GaN layer of about 1 $\mu$m to about 20 $\mu$ms is preferred. Coatings much thicker than 20 $\mu$ms tend to be less transparent because of inclusions or defects incorporated into the crystal structure.

The hydrogenated amorphous Si a-SiH can be deposited on top of the GaN layer by methods known in the art, such as the glow discharge decomposition of silane $SiH_4$ (D. E. Carlson and C. R. Wronski, Appl. Phys. Letters 28, pp. 671-673, 1976).

In operation of the solar cell 10, solar radiation 50 impinges on the body 12 at the incident surface 14. As is well known in the art, solar radiation absorbed by a semiconductor body generates electron-hole pairs. Most of the pairs will be generated within the electric field region extending about the P-N junction. These charge carriers will be drifted by the electric field. Some of the charge carriers generated beyond the region of built-in field will also participate in the photovoltaic effect as follows. When the first layer 18 is of N-type conductivity, the holes generated within the first layer 18 are minority carriers while the electron carriers generated in the P-type conductivity second layer 20 are minority carriers in layer 20. Some of the minority carriers will diffuse toward the built-in electric field of the P-N junction.

The minority carriers crossing the P-N junction 22 generate a flow of electric current. The electrons crossing the P-N junction 22 from the P-type conductivity material 20 to the N-type conductivity material 18 are collected by the gallium nitride electrode 26. The high electrical conductivity, high thermal conductivity (1.7 w/cm °K) and stability to elevated temperatures (up to 900° C.) and resistance to corrosive ambients makes gallium nitride a highly effective collecting window for solar cells. The gallium nitride layer avoids the necessity of metallized fingers to collect the electrons which fingers result in a shadowing effect and lower efficiency for the cell.

I claim:
1. A semiconductor photovoltaic device comprising: a body of semiconductor material; means in said body for defining a P-N junction, said means including an N-type layer having a surface; and a transparent, conductive gallium nitride electrode layer on said surface contacting said N-type region and forming an ohmic contact thereto.

2. The semiconductor photovoltaic device according to claim 1 wherein the gallium nitride electrode layer is from about 1 $\mu$m to about 20 $\mu$ms thick.

3. The semiconductor photovoltaic device according to claim 2 further comprising a metal electrode contacting the P-type layer of said semiconductor body.

4. The semiconductor photovoltaic device according to claim 3 wherein said semiconductor body is formed from material selected from the group consisting of crystalline silicon, hydrogenated amorphous silicon, cadmium telluride, gallium arsenide, and gallium arsenide-aluminum arsenide alloys.

5. A semiconductor photovoltaic device comprising a substrate, a transparent conductive N-type gallium nitride electrode layer deposited on said substrate, forming a heterotransition and ohmic contact with the N-type layer of a semiconductor body having an N-type and a P-type layer forming a P-N junction therebetween and a metal electrode contacting said P-type layer.

6. A semiconductor photovoltaic device in accordance with claim 5, wherein said gallium nitride layer is from about 1 $\mu$m to about 20 $\mu$ms thick.

7. A semiconductor photovoltaic device comprising a semiconductor material which is stable at 900° C. and which is doped to form N and P type layers, thereby forming a P-N junction therebetween, a metal electrode contacting said P-type portion of said semiconductor and an N-type transparent, conductive gallium nitride electrode layer forming an ohmic contact with said N-type semiconductor layer.

* * * * *